(12) United States Patent
Haywood et al.

(10) Patent No.: US 11,282,552 B2
(45) Date of Patent: *Mar. 22, 2022

(54) MEMORY BUFFER WITH DATA SCRAMBLING AND ERROR CORRECTION

(71) Applicant: Rambus Inc., Sunnyvale, CA (US)

(72) Inventors: Christopher Haywood, Chapel Hill, NC (US); David Wang, Westlake Village, CA (US)

(73) Assignee: Rambus Inc., San Jose, CA (US)

( * ) Notice: Subject to any disclaimer, the term of this patent is extended or adjusted under 35 U.S.C. 154(b) by 54 days.

This patent is subject to a terminal disclaimer.

(21) Appl. No.: 16/831,121

(22) Filed: Mar. 26, 2020

(65) Prior Publication Data

US 2020/0357446 A1 Nov. 12, 2020

Related U.S. Application Data

(63) Continuation of application No. 15/978,344, filed on May 14, 2018, now Pat. No. 10,607,669, which is a continuation of application No. 14/923,345, filed on Oct. 26, 2015, now Pat. No. 9,972,369, which is a continuation of application No. 13/791,124, filed on
(Continued)

(51) Int. Cl.
| | | |
|---|---|---|
| G11C 7/10 | (2006.01) | |
| G06F 11/10 | (2006.01) | |
| G06F 11/07 | (2006.01) | |
| G11C 29/52 | (2006.01) | |

(Continued)

(52) U.S. Cl.
CPC .......... *G11C 7/1072* (2013.01); *G06F 11/073* (2013.01); *G06F 11/0778* (2013.01); *G06F 11/0787* (2013.01); *G06F 11/1044* (2013.01); *G06F 11/1048* (2013.01); *G06F 11/1068* (2013.01); *G11C 7/1006* (2013.01); (Continued)

(58) Field of Classification Search
CPC ....... G11C 7/1072; G11C 7/1006; G11C 5/04; G11C 29/52; G11C 2029/0411; G06F 11/073; G06F 11/0778; G06F 11/0787; G06F 11/1044; G06F 11/1048; G06F 11/1068; G06F 11/1008
See application file for complete search history.

(56) References Cited

U.S. PATENT DOCUMENTS 7,492,807 B1 2/2009 Buchmann et al.
7,916,574 B1 3/2011 Solomon et al.
(Continued)

OTHER PUBLICATIONS

Dreps, Daniel, "The 3rd Generation of IBM's Elastic Interface on POWER6TM", 2007 IEEE Hot Chips 19 Symposium (HCS), IEEE, Aug. 19-21, 2007, pp. 2-31, 16 Pages.

*Primary Examiner* — Kyle Vallecillo
(74) *Attorney, Agent, or Firm* — Lowenstein Sandler LLP

(57) ABSTRACT

A method for operating a DRAM device. The method includes receiving in a memory buffer in a first memory module hosted by a computing system, a request for data stored in RAM of the first memory module from a host controller of the computing system. The method includes receiving with the memory buffer, the data associated with a RAM, in response to the request and formatting with the memory buffer, the data into a scrambled data in response to a pseudo-random process. The method includes initiating with the memory buffer, transfer of the scrambled data into an interface device.

20 Claims, 7 Drawing Sheets

Related U.S. Application Data

Mar. 8, 2013, now Pat. No. 9,170,878, which is a continuation-in-part of application No. 13/619,692, filed on Sep. 14, 2012, now Pat. No. 8,880,790, which is a continuation-in-part of application No. 13/359,877, filed on Jan. 27, 2012, now Pat. No. 8,694,721.

(60) Provisional application No. 61/691,736, filed on Aug. 21, 2012, provisional application No. 61/682,412, filed on Aug. 13, 2012, provisional application No. 61/661,549, filed on Jun. 19, 2012, provisional application No. 61/473,889, filed on Apr. 11, 2011.

(51) Int. Cl.
  *G11C 29/04* (2006.01)
  *G11C 5/04* (2006.01)

(52) U.S. Cl.
  CPC ............ *G06F 11/1008* (2013.01); *G11C 5/04* (2013.01); *G11C 29/52* (2013.01); *G11C 2029/0411* (2013.01)

(56) References Cited

U.S. PATENT DOCUMENTS

| | | |
|---|---|---|
| 8,539,145 B1 | 9/2013 | Warnes et al. |
| 2005/0132147 A1 | 6/2005 | Arimilli et al. |
| 2005/0132148 A1 | 6/2005 | Arimilli et al. |
| 2006/0179242 A1 | 8/2006 | Ghai et al. |
| 2006/0179243 A1 | 8/2006 | Fields, Jr. et al. |
| 2006/0179245 A1 | 8/2006 | Fields, Jr. et al. |
| 2006/0179246 A1 | 8/2006 | Fields, Jr. et al. |
| 2006/0179247 A1 | 8/2006 | Fields., Jr. et al. |
| 2006/0179248 A1 | 8/2006 | Fields, Jr. et al. |
| 2007/0162670 A1 | 7/2007 | Yang et al. |
| 2008/0177940 A1 | 7/2008 | Risse |
| 2008/0183959 A1 | 7/2008 | Pelley et al. |
| 2009/0031078 A1 | 1/2009 | Warnes et al. |
| 2009/0037641 A1 | 2/2009 | Bresniker |
| 2009/0177853 A1 | 7/2009 | Mazzola et al. |
| 2009/0198965 A1 | 8/2009 | Arimilli et al. |
| 2009/0300259 A1 | 12/2009 | Luo et al. |
| 2010/0005281 A1 | 1/2010 | Buchmann et al. |
| 2010/0023800 A1* | 1/2010 | Harari .................. G06F 12/0246 714/2 |
| 2010/0107010 A1 | 4/2010 | Warnes et al. |
| 2010/0025470 A1 | 8/2010 | Moshayedi et al. |
| 2010/0293420 A1 | 11/2010 | Kapil et al. |
| 2010/0299576 A1 | 11/2010 | Baysah et al. |
| 2011/0040924 A1* | 2/2011 | Selinger .................. G06F 11/10 711/103 |
| 2011/0041005 A1* | 2/2011 | Selinger .................. G06F 11/10 714/719 |
| 2011/0041039 A1* | 2/2011 | Harari .................... G11C 29/76 714/773 |
| 2011/0082971 A1 | 4/2011 | Berke |
| 2011/0161554 A1* | 6/2011 | Selinger .............. G06F 13/1668 711/103 |
| 2011/0161587 A1 | 6/2011 | Guthrie et al. |
| 2011/0161784 A1* | 6/2011 | Selinger .............. G06F 11/1016 714/768 |
| 2011/0302366 A1 | 12/2011 | Peterson et al. |
| 2012/0005416 A1* | 1/2012 | Lee ..................... G06F 12/0246 711/103 |
| 2012/0023318 A1 | 1/2012 | Xing et al. |
| 2012/0102554 A1 | 4/2012 | Emerick et al. |
| 2012/0173936 A1 | 7/2012 | Johnson et al. |
| 2012/0204079 A1 | 8/2012 | Takefman et al. |
| 2012/0257459 A1 | 10/2012 | Berke |
| 2012/0260137 A1 | 10/2012 | Berke |
| 2014/0237157 A1 | 8/2014 | Takefman et al. |

* cited by examiner

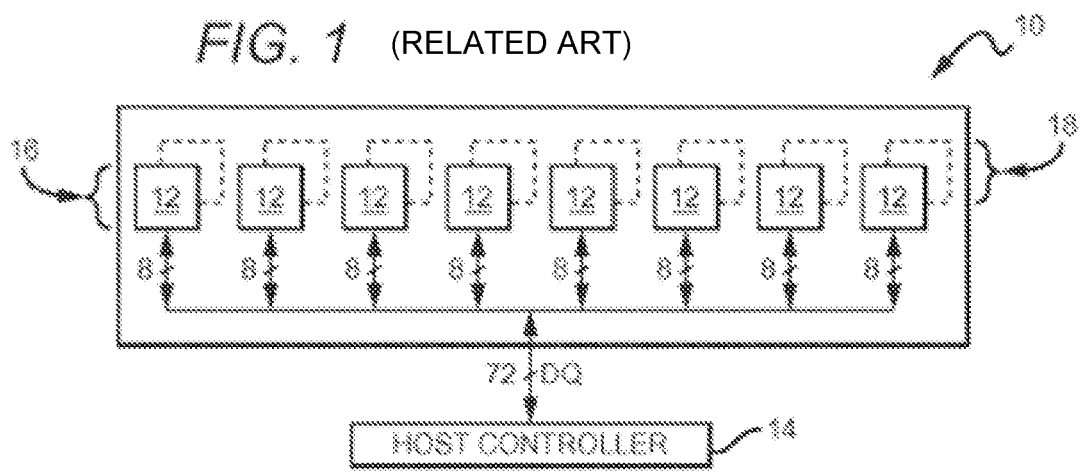
FIG. 1 (RELATED ART)
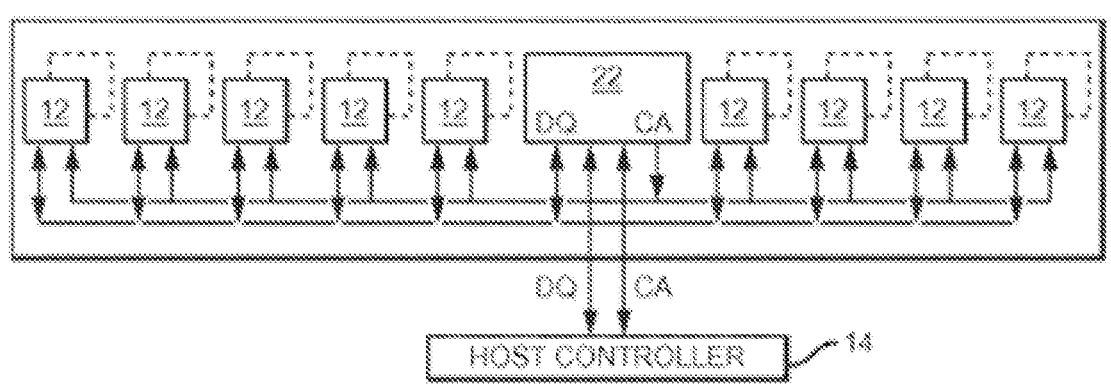
(RELATED ART) FIG. 2
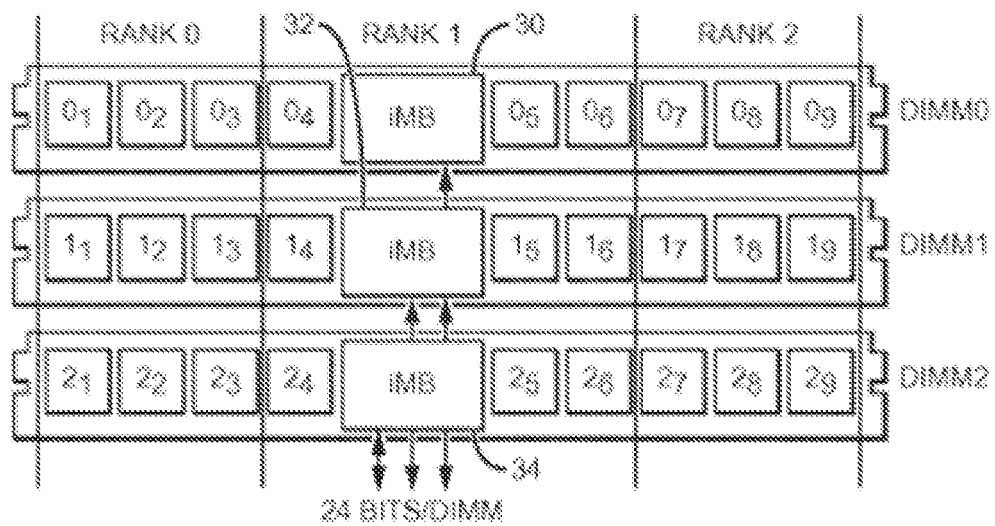
FIG. 3

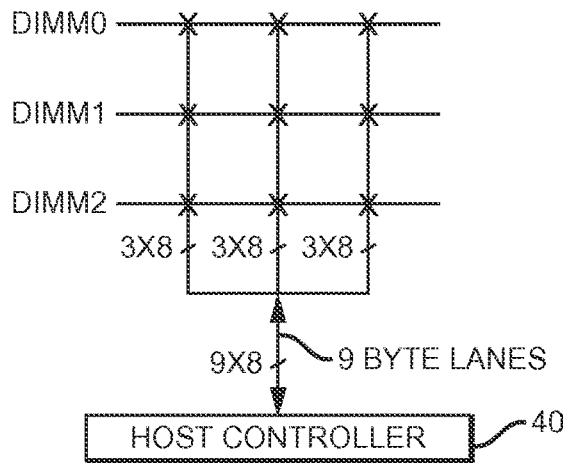
FIG. 4a
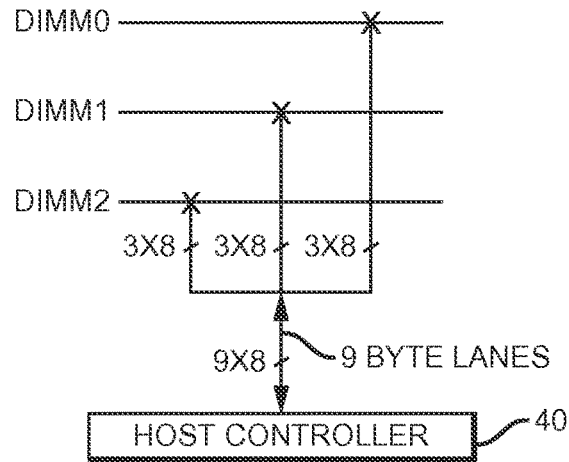
FIG. 4b
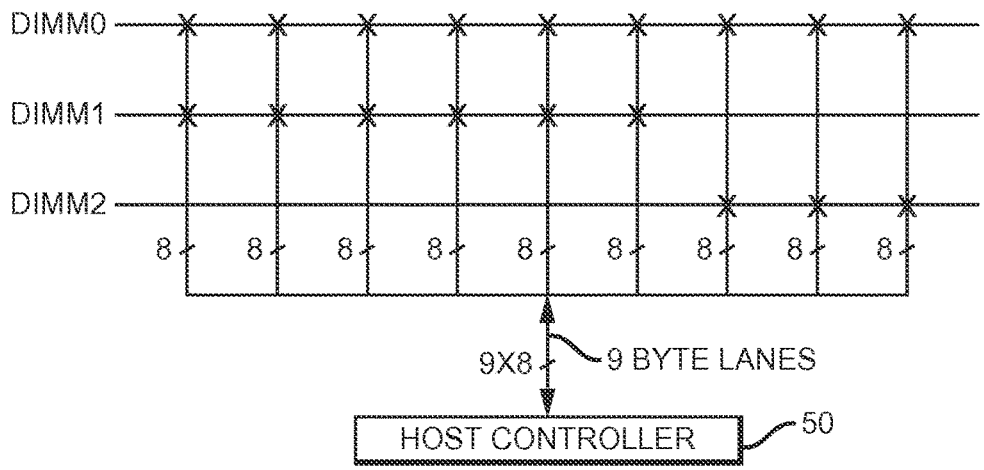
FIG. 5a
FIG. 5b

FIG. 5c

|       | Byte 0 | Byte 1 | Byte 2 | Byte 3 | Byte 4 | Byte 5 | Byte 6 | Byte 7 | Byte 8 |
|-------|--------|--------|--------|--------|--------|--------|--------|--------|--------|
| DIMM2 | X      | X      | X      |        |        |        |        |        |        |
| DIMM1 |        |        |        | X      | X      | X      | X      | X      | X      |
| DIMM0 | X      | X      | X      | X      | X      | X      | X      | X      | X      |

TWO DIMMS, RANK 0

FIG. 5d

|       | Byte 0 | Byte 1 | Byte 2 | Byte 3 | Byte 4 | Byte 5 | Byte 6 | Byte 7 | Byte 8 |
|-------|--------|--------|--------|--------|--------|--------|--------|--------|--------|
| DIMM2 | X      | X      | X      |        |        |        |        |        |        |
| DIMM1 |        |        |        | X      | X      | X      | X      | X      | X      |
| DIMM0 | X      | X      | X      | X      | X      | X      | X      | X      | X      |

TWO DIMMS, RANK 1

FIG. 5e

|       | Byte 0 | Byte 1 | Byte 2 | Byte 3 | Byte 4 | Byte 5 | Byte 6 | Byte 7 | Byte 8 |
|-------|--------|--------|--------|--------|--------|--------|--------|--------|--------|
| DIMM2 | X      | X      | X      |        |        |        |        |        |        |
| DIMM1 |        |        |        | X      | X      | X      | X      | X      | X      |
| DIMM0 | X      | X      | X      | X      | X      | X      | X      | X      | X      |

THREE DIMMS, RANK 0

FIG. 5f

|       | Byte 0 | Byte 1 | Byte 2 | Byte 3 | Byte 4 | Byte 5 | Byte 6 | Byte 7 | Byte 8 |
|-------|--------|--------|--------|--------|--------|--------|--------|--------|--------|
| DIMM2 | X      | X      | X      |        |        |        |        |        |        |
| DIMM1 |        |        |        | X      | X      | X      | X      | X      | X      |
| DIMM0 | X      | X      | X      | X      | X      | X      | X      | X      | X      |

THREE DIMMS, RANK 1

FIG. 5g

|       | Byte 0 | Byte 1 | Byte 2 | Byte 3 | Byte 4 | Byte 5 | Byte 6 | Byte 7 | Byte 8 |
|-------|--------|--------|--------|--------|--------|--------|--------|--------|--------|
| DIMM2 | X      | X      | X      |        |        |        |        |        |        |
| DIMM1 |        |        |        | X      | X      | X      | X      | X      | X      |
| DIMM0 | X      | X      | X      | X      | X      | X      | X      | X      | X      |

THREE DIMMS, RANK 2

FIG. 6a — SINGLE DIMM, RANK 0

FIG. 6b — TWO DIMMS, RANK 0

FIG. 6c — TWO DIMMS, RANK 1

FIG. 6d — THREE DIMMS, RANK 0

FIG. 6e — THREE DIMMS, RANK 1

FIG. 6f — THREE DIMMS, RANK 2

FIG. 7a

|       | Byte 0 | Byte 1 | Byte 2 | Byte 3 | Byte 4 | Byte 5 | Byte 6 | Byte 7 | Byte 8 |
|-------|--------|--------|--------|--------|--------|--------|--------|--------|--------|
| DIMM3 | X      | X      | X      |        |        |        |        |        |        |
| DIMM2 |        |        |        |        |        |        | X      | X      | X      |
| DIMM1 | X      | X      | X      | X      | X      | X      |        |        |        |
| DIMM0 |        |        |        | X      | X      | X      | X      | X      | X      |

TWO DIMMS, RANK 0

FIG. 7b

|       | Byte 0 | Byte 1 | Byte 2 | Byte 3 | Byte 4 | Byte 5 | Byte 6 | Byte 7 | Byte 8 |
|-------|--------|--------|--------|--------|--------|--------|--------|--------|--------|
| DIMM3 | X      | X      | X      |        |        |        |        |        |        |
| DIMM2 |        |        |        |        |        |        | X      | X      | X      |
| DIMM1 | X      | X      | X      | X      | X      | X      |        |        |        |
| DIMM0 |        |        |        | X      | X      | X      | X      | X      | X      |

TWO DIMMS, RANK 1

FIG. 7c

|       | Byte 0 | Byte 1 | Byte 2 | Byte 3 | Byte 4 | Byte 5 | Byte 6 | Byte 7 | Byte 8 |
|-------|--------|--------|--------|--------|--------|--------|--------|--------|--------|
| DIMM3 | X      | X      | X      |        |        |        |        |        |        |
| DIMM2 |        |        |        |        |        |        | X      | X      | X      |
| DIMM1 | X      | X      | X      | X      | X      | X      |        |        |        |
| DIMM0 |        |        |        | X      | X      | X      | X      | X      | X      |

THREE DIMMS, ALL RANKS

FIG. 7d

|       | Byte 0 | Byte 1 | Byte 2 | Byte 3 | Byte 4 | Byte 5 | Byte 6 | Byte 7 | Byte 8 |
|-------|--------|--------|--------|--------|--------|--------|--------|--------|--------|
| DIMM3 | X      | X      | X      |        |        |        |        |        |        |
| DIMM2 |        |        |        |        |        |        | X      | X      | X      |
| DIMM1 | X      | X      | X      | X      | X      | X      |        |        |        |
| DIMM0 |        |        |        | X      | X      | X      | X      | X      | X      |

FOUR DIMMS, RANK 0

*FIG. 7e*

|       | Byte 0 | Byte 1 | Byte 2 | Byte 3 | Byte 4 | Byte 5 | Byte 6 | Byte 7 | Byte 8 |
|-------|--------|--------|--------|--------|--------|--------|--------|--------|--------|
| DIMM3 | X      | X      | X      |        |        |        |        |        |        |
| DIMM2 |        |        |        |        |        |        | X      | X      | X      |
| DIMM1 | X      | X      | X      | X      | X      | X      |        |        |        |
| DIMM0 |        |        |        | X      | X      | X      | X      | X      | X      |

FOUR DIMMS, RANK 1

*FIG. 7f*

|       | Byte 0 | Byte 1 | Byte 2 | Byte 3 | Byte 4 | Byte 5 | Byte 6 | Byte 7 | Byte 8 |
|-------|--------|--------|--------|--------|--------|--------|--------|--------|--------|
| DIMM3 | X      | X      | X      |        |        |        |        |        |        |
| DIMM2 |        |        |        |        |        |        | X      | X      | X      |
| DIMM1 | X      | X      | X      | X      | X      |        |        |        |        |
| DIMM0 |        |        |        | X      | X      | X      | X      | X      | X      |

FOUR DIMMS, RANK 2

*FIG. 7g*

|       | Byte 0 | Byte 1 | Byte 2 | Byte 3 | Byte 4 | Byte 5 | Byte 6 | Byte 7 | Byte 8 |
|-------|--------|--------|--------|--------|--------|--------|--------|--------|--------|
| DIMM3 | X      | X      | X      |        |        |        |        |        |        |
| DIMM2 |        |        |        |        |        |        | X      | X      | X      |
| DIMM1 | X      | X      | X      | X      | X      | X      |        |        |        |
| DIMM0 |        |        |        | X      | X      | X      | X      | X      | X      |

FOUR DIMMS, RANK 3

*FIG. 8a*

|       | Byte 0 | Byte 1 | Byte 2 | Byte 3 | Byte 4 | Byte 5 | Byte 6 | Byte 7 | Byte 8 |
|-------|--------|--------|--------|--------|--------|--------|--------|--------|--------|
| SLOT0 | X      | X      | X      | X      | X      | X      | X      | X      |        |
| SLOT1 | X      | X      | X      | X      | X      | X      | X      | X      | X      |

TWO DIMMS, RANK 0

*FIG. 8b*

|       | Byte 0 | Byte 1 | Byte 2 | Byte 3 | Byte 4 | Byte 5 | Byte 6 | Byte 7 | Byte 8 |
|-------|--------|--------|--------|--------|--------|--------|--------|--------|--------|
| SLOT0 | X      | X      | X      | X      | X      | X      | X      | X      | X      |
| SLOT1 | X      | X      | X      | X      | X      | X      | X      | X      | X      |

TWO DIMMS, RANK 1

MEMORY BUFFER WITH DATA SCRAMBLING AND ERROR CORRECTION

CROSS-REFERENCE TO RELATED APPLICATIONS

The present invention is a continuation of and claims priority to U.S. application Ser. No. 15/978,344, filed May 14, 2018, now U.S. Pat. No. 10,607,669, issued Mar. 31, 2020, which is a continuation of and claims priority to U.S. application Ser. No. 14/923,345, filed Oct. 26, 2015, now U.S. Pat. No. 9,972,369, issued May 15, 2018, which is a continuation of and claims priority to U.S. application Ser. No. 13/791,124, filed Mar. 8, 2013, now U.S. Pat. No. 9,170,878, issued Oct. 27, 2015, which is a non-provisional of and claims priority to U.S. Provisional Application Nos. 61/682,412 filed Aug. 13, 2012, 61/661,549 filed Jun. 19, 2012, and is a continuation in part of U.S. application Ser. No. 13/619,692 filed Sep. 14, 2012, now U.S. Pat. No. 8,880,790, issued Nov. 4, 2014 which is a non-provisional of Application No. 61/691,736 filed Aug. 21, 2012. U.S. application Ser. No. 13/619,692 also claims priority to and is a continuation-in-part of application Ser. No. 13/359,877 filed Jan. 27, 2012, now U.S. Pat. No. 8,694,721, issued Apr. 8, 2014, which claims priority to Application No. 61/473,889 filed Apr. 11, 2011, each of which is commonly owned, and hereby incorporated by reference herein. The present application is also related to U.S. Ser. Nos. 12/267,355 and 12/563,308, commonly owned, and hereby incorporated by reference herein.

BACKGROUND

This invention relates generally to memory systems, and more particularly to memory systems which include a memory buffer that serves as an interface between a host controller and the RAM chips (typically DRAM) residing on a DIMM, the memory buffer being optionally located on the DIMM itself or as part of the motherboard on which the DIMM connectors are also located.

Traditional computer systems, such as servers, workstations, desktops and laptops, all use pluggable memory which can be inserted into slots on the computer's motherboard as needed. As shown in FIG. 1, the most common form of pluggable memory 10 is the Dual In-line Memory Module (DIMM). Historically, DIMMs contain multiple RAM chips—typically DRAM—each of which has a data bus width of 4 or 8 bits. Typically, eight or nine 8-bit DRAM chips 12 (or twice as many 4-bit DRAM chips) are arranged in parallel to provide each DIMM 16 and 18 with a total data bus width of 64 or 72 bits; the data bus, typically referred to as the 'DQ' bus, is connected to a host controller 14. Each arrangement of 64 or 72 data bits using DRAM chips 12 in parallel is termed a 'rank'.

A command/address (CA) bus also runs between the host controller 14 and each DIMM 16 and 18; the CA and DQ busses together form a 'system' bus. With a basic unbuffered DIMM 16, the CA bus is connected to every DRAM 12 on the DIMM 16. As a result, there is a high electrical load on the CA bus, given by the product of the number of DRAMs times the number of ranks For the DQ bus, the number of electrical loads is equal to the number of ranks.

A buffering device is employed to reduce loading in a 'load reduction' DIMM (LR-DIMM), an example of which is illustrated in FIG. 2. An LR-DIMM 20 containing multiple DRAM chips 12 uses a logic device 22 to buffer the DQ and CA signals between the DRAMs 12 and a host controller 14. Logic device 22 may be, for example, a single device such as the iMB (isolating Memory Buffer) from Inphi Corporation. Memory systems of this sort are described, for example, in co-pending U.S. patent application Ser. Nos. 12/267,355 and 12/563,308, which are incorporated herein by reference, for all purposes.

SUMMARY OF INVENTION

This invention relates generally to memory systems, and more particularly to memory systems which include a memory buffer that serves as an interface between a host controller and the RAM chips (typically DRAM) residing on a DIMM, the memory buffer being optionally located on the DIMM itself or as part of the motherboard on which the DIMM connectors are also located.

In an example, the present invention provides a method for operating a DRAM device. The method includes receiving in a memory buffer in a first memory module hosted by a computing system, a request for data stored in RAM of the first memory module from a host controller of the computing system. The method includes receiving with the memory buffer, the data associated with a RAM, in response to the request and formatting with the memory buffer, the data into a scrambled data in response to a pseudo-random process. The method includes initiating with the memory buffer, transfer of the scrambled data into an interface device.

These and other features, aspects, and advantages of the present invention will become better understood with reference to the following description and claims.

DESCRIPTION OF THE DRAWINGS

In order to more fully understand the present invention, reference is made to the accompanying drawings. Understanding that these drawings are not to be considered limitations in the scope of the invention, the presently described embodiments and the presently understood best mode of the invention are described with additional detail through use of the accompanying drawings in which:

FIG. 1 is a block/schematic diagram of a memory system which employs unbuffered DIMMs.

FIG. 2 is a block/schematic diagram of a memory system which employs LRDIMMs.

FIG. 3 is a diagram illustrating the re-mapping concepts of the present invention.

FIGS. 4a and 4b are diagrams illustrating the connections between the host controller and the DIMM slots for a conventional memory system and for a memory system per the present invention, respectively.

FIG. 5a is a diagram illustrating one possible way in which three DIMM slots can be wired to the host controller per the present invention.

FIGS. 5b-5g are tables depicting a possible arrangement of connections between host and DIMM slots for a three slot system, covering the mapping of ranks 0, 1 and 2 for populations of one, two and three DIMMs.

FIGS. 6a-6f are tables depicting a possible arrangement of connections between host and DIMM slots for a three slot system, covering the mapping of ranks 0, 1 and 2 for populations of one, two and three DIMMs, for systems employing x4 DRAMs.

FIGS. 7a-7g are tables depicting a possible arrangement of connections between host and DIMM slots for a four slot system, covering the mapping of ranks 0, 1, 2 and 3 for populations of two, three and four DIMMs.

FIGS. 8a-8b are tables depicting a possible arrangement of connections between host and DIMM slots for a two slot system, covering the mapping of ranks 0 and 1 for two DIMMs.

DETAILED DESCRIPTION OF THE SPECIFIC EMBODIMENTS

This invention relates generally to memory systems, and more particularly to memory systems which include a memory buffer that serves as an interface between a host controller and the RAM chips (typically DRAM) residing on a DIMM, the memory buffer being optionally located on the DIMM itself or as part of the motherboard on which the DIMM connectors are also located.

This invention uses techniques and features that are embedded or associated with a memory buffer device so that data can be shared between a host controller and the memory buffer that is used to isolate the data and load of the DRAMs from the host bus. The memory buffer can also assist the host in various tasks such as storing data under error conditions for either re-issuing a cycle or logging the data for analysis.

The present method and system is for use with memory systems which include one or more DIMMs that plug into respective slots. Each DIMM includes a memory buffer circuit arranged to buffer data bytes being written to or read from the DIMM by a host controller, via the DQ bus for example; the memory buffer is also preferably arranged to serve as an interface for the system's command/address (CA bus). Conventionally, such a memory system is organized such that the bytes of a given data word are conveyed to the DIMMs via respective byte lanes that run between the host controller and every DIMM slot, and are stored in a given rank on a given DIMM. However, as noted above, this arrangement can give rise to problems concerning, for example, operating frequency, power consumption, heat dissipation and system timing.

These issues are addressed by re-mapping the RAM chips that constitute a given rank across the available DIMMs, such that a data word to be stored in a given rank is striped across the available DIMMs; the RAM chips are referred to herein as DRAM, though other types of RAM might also be used. Re-mapping the ranks in this way serves to reduce the loading on a given byte lane that might otherwise be present.

An example of this approach is illustrated conceptually in FIG. 3. Three DIMMs (DIMM0, DIMM1, DIMM2) are shown in this example, each of which includes a memory buffer circuit (30, 32, 34) and nine DRAMs (01 . . . 09, 11 . . . 19, 21 . . . 29).

Conventionally, the nine DRAMs within each DIMM would constitute a rank; for example, DRAMs 01 . . . 09 would form rank 0, DRAMs 11 . . . 19 would form rank 1, and DRAMs 21 . . . 29 would form rank 2. A data word made up of nine bytes would be stored in one of the ranks; the specific rank would be specified via a 'chip select' (CS) signal provided to each rank.

Here, however, the DRAMs that constitute a given rank are re-mapped across the available DIMMs, such that a data word to be stored in a given rank is striped across the available DIMMs. For example, the system might arranged such rank 0 consists of DRAMs 01 . . . 03 of DIMM0, DRAMs 11 . . . 13 of DIMM1, and DRAMs 21 . . . 23 of DIMM2. A data word having nine bytes (bytes 0 . . . 8 might be stored as follows: —bytes 0, 1 and 2 in DRAMs 01, 02, 03, respectively; —bytes 3, 4 and 5 in DRAMs 11, 12, 13, respectively; and—bytes 6, 7 and 8 in DRAMs 21, 22, 23, respectively.

Similarly, rank 1 could be re-mapped such that it consists of DRAMs 04 . . . 06, 14 . . . 16, and 24 . . . 26, and rank 2 could be re-mapped such that it consists of DRAMs 07 . . . 09, 17 . . . 19, and 27 . . . 29. In this way, 24 bits of the data word are stored in each of the three DIMMs.

Note that DIMM numbering, DRAM numbering and byte numbering are completely arbitrary.

As previously noted, the bytes of a data word are conveyed between a host controller and the DIMMs via respective byte lanes. In this example, the nine byte lanes can be distributed across the three DIMMs; when so arranged, each byte lane is subject to only one electrical load, as three bytes would be routed from the host controller for each of the three DIMMs.

This is illustrated in the diagrams shown in FIGS. 4a and 4b. FIG. 4a depicts a conventional arrangement, in which each of the nine 8-bit byte lane must be connected between the host controller 40 and each of the three DIMM slots (DIMM0, DIMM1, DIMM2-connections indicated by an 'X).

However, in FIG. 4b, wiring between host 40 and the DIMM slots only need be provided as shown, with three byte lanes wired to each of the three DIMM slots. Thus, the present method reduces the amount of wiring—typically located on a motherboard to which the host controller and DIMM slots are mounted—that is needed between the host and the slots.

Note that the example illustrated in FIG. 4b is likely to be impractical, since it requires that all three DIMM slots be filled.

In order to implement the present method, the memory buffer circuit must have the capability to route data bytes to different byte lanes and thereby different DRAMs for data reads, and vice-versa routing for writes—as a function of the original destination rank. Along with the wiring between host controller and DIMM slots, this is part of the re-mapping process, the control of which is shared across the memory buffer devices.

Note that DIMMs used with the present method are not limited in the number of ranks they can support. For example, a traditional DIMM that contains four ranks of DRAMs, with each rank containing, for example, nine 8-bit DRAM components for a total of 36 DRAMs, can be re-mapped using the techniques described above.

In order to support multiple and various DIMM populations, as well as alternate system options, the byte lanes do, in fact, have to be shared across the DIMM slots. In order to achieve maximum system clock rates, the maximum loading on any one byte lane is preferably limited to two electrical loads. The description that follows will show several exemplary configurations; however, many others could be conceived by applying the basic principles of the byte striping described herein. Note that most DIMM-based memory systems employ a population rule that DIMMs must be fitted starting with the DIMM slot that is furthest away from the host controller—i.e., the slot at the far end of the system bus—referred to herein as DIMM0. The next DIMM to be fitted (DIMM1) is installed in the slot just before DIMM0, and so on.

In the case of a system with three DIMM slots, it may be required to support a single DIMM alone, two DIMMs together, or three DIMMs when the slots are fully populated. One possible way in which the three slots can be wired to the host controller 50 is shown in FIG. 5a; as in FIG. 4, an 'X' represents a connection between the host and the DIMM slots.

To accommodate the case in which only one DIMM is installed (in DIMM0), all of the byte lanes must be connected to the DIMM0 slot, as shown in FIG. 5a. Another way to depict the connections between host and slots is by means of a table as shown in FIG. 5b. In this and subsequent tables of this sort, an "X" represents a connection between the DIMM slot indicated on the left and the byte lane connected to the host controller as indicated at the top, and the shading represents the byte lanes with which the memory buffer on the DIMM in that slot will be receiving and sending data to/from the host controller. The diagram in FIG. 5b depicts the three slot/one DIMM case; therefore, all of the connections to DIMM0 are shaded, as the single DIMM in this slot will store the entire data word (i.e., no striping).

If a second DIMM is used, it would be plugged into DIMM1. However, in accordance with the present invention, DIMM1 does not need to be connected to all 9 byte lanes, as the ranks can now be striped. One way (of potentially several) to map the ranks for this case is shown in FIGS. 5c (which shows how rank 0 might be striped) and 5d (rank 1). This configuration would require 6 byte lanes to be wired to the DIMM1 slot. This is the preferred configuration because it allows for a minimum number of CS lines on the striped DIMMs. When so arranged, data words addressed to the first and second ranks might be stored as follows:

DIMM0: Rank 0 bytes 0-5 and Rank 1 bytes 0-2
DIMM1: Rank 0 bytes 6-8 and Rank 1 bytes 3-8

One alternative way to stripe the bytes for the two DIMM case requires only 5 lanes to be wired to DIMM1: DIMM0: Rank 0 bytes 0-3, Rank 1 bytes 0-4 DIMM1: Rank 0 bytes 4-8, Rank 1 bytes 5-8

Another alternative could be employed if the DRAMs on the DIMMs are x4 devices. In this case the mapping requires only 9 nibbles to be wired to DIMM1: DIMM0: Rank 0 nibbles 0-8, Rank 1 nibbles 0-8 DIMM1: Rank 0 nibbles 9-17, Rank 1 nibbles 9-17

To support the third slot (DIMM2), only three byte lanes are required to be wired to the connector. This is the example illustrated above in FIG. 4b. FIGS. 5e, 5f and 5g illustrate possible mapping arrangements for rank 0, rank 1, and rank 2, respectively, when three DIMMs are installed.

In summary the wiring to the DIMM slots in this example is: DIMM0: 9 byte lanes DIMM 1: 6 byte lanes DIMM2: 3 byte lanes This wiring arrangement enables each byte lane to be subject to no more than 2 electrical loads, as follows:

DIMM0: bytes 0, 1, 2, 3, 4, 5, 6, 7, 8
DIMM1: bytes 3, 4, 5, 6, 7, 8
DIMM2: bytes 0, 1, 2

Obviously, when only a single DIMM slot is populated, no striping is needed.

Figures 6D, 6E, 6F:
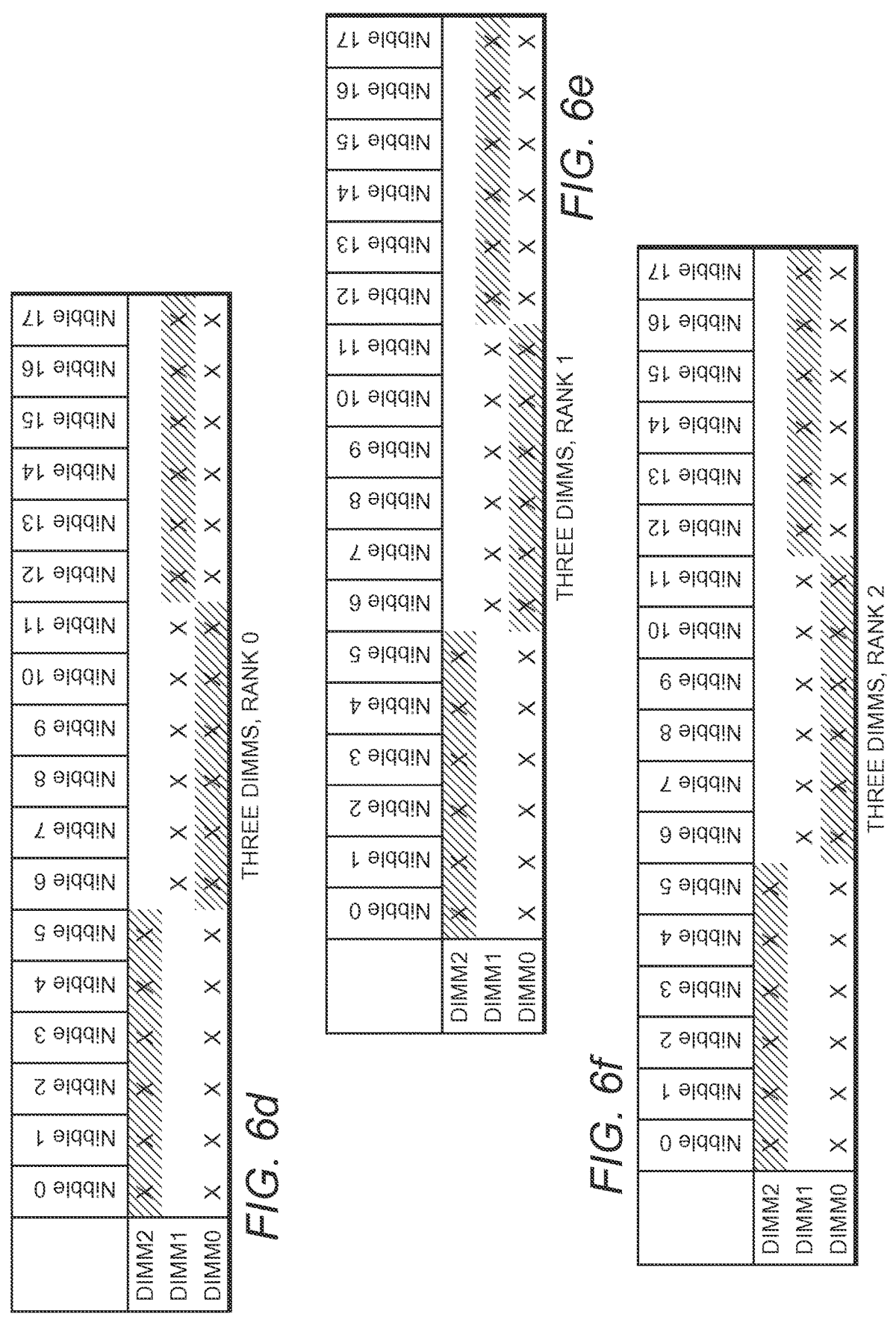

As mentioned, x4 DRAMs can also be striped. Possible mapping is shown in FIGS. 6a (single DIMM, rank 0), 6b and 6c (two DIMMs, ranks 0 and 1, respectively), and 6d, 6e and 6f (three DIMMs, ranks 0, 1 and 2, respectively).

To design a system that has four DIMM slots, but which still maintains the advantages of reducing electrical loads, a new population rule must be adopted: at least two of the DIMM slots must always be populated. To be consistent with the previous population rule of installing DIMMs starting with the slot furthest from the host controller, then when two DIMMs are used, they will be installed in DIMM0 and DIMM1. If three DIMMs are installed, they will be fitted into slots DIMM0, DIMM1 and DIMM2. Finally, four DIMMs will occupy all four slots (DIMM0, DIMM1, DIMM2 and DIMM3).

Exemplary mapping arrangements for a system with four DIMM slots is shown in FIGS. 7a-7g. FIGS. 7a and 7b show the two DIMM case, with the mapping of ranks 0 and 1 shown in FIGS. 7a and 7b, respectively. FIG. 7c shows the three DIMM case, which has been discussed extensively above. The four DIMM case is depicted in FIGS. 7d-7g, with the mapping of ranks 0, 1, 2 and 3 shown in FIGS. 7d, 7e, 7f and 7g, respectively.

Note that in FIGS. 7d-7g depicting the four DIMM case, each figure shows a grouping of three bytes for mapping functions. Using a 3 byte group as the fundamental option is preferred; however, doing so means that the ranks are striped across three DIMMs only. From a power distribution perspective, this is slightly less optimal than using all four DIMMs for all ranks A striped configuration as described herein may also be considered even if the system is designed with just 2 DIMM slots. All 9 byte lanes would be connected to both DIMM slots. However, the memory buffer device on the DIMM does not need to select and switch the byte lanes. Rather, the byte lanes can be connected directly from the DRAM devices to the edge connector, provided the DRAM is only a single load (this could either be a single DRAM die as exists today or could a device such as the upcoming "TSV" stacked DRAMs).

The control logic section of the memory buffer would still be required to correctly decode the CS signals for either 5 bytes or 4 bytes as already described above—i.e., 5 bytes from DIMM 0 and 4 from DIMM 1 and vice-versa for other rank decodes. One way to map the ranks for this case is shown in FIGS. 8a (which shows how rank 0 might be striped) and 8b (rank 1). This approach enables the power distribution advantages discussed above to be maintained. Load reduction is achieved by using a single DRAM or TSV DRAMs.

As noted above, the mapping diagrams shown above are merely exemplary; there are many ways in which re-mapping in accordance with the present method could be performed. It is only essential that the ranks be striped across the available DIMMs so as to reduce the loading on a given byte lane that might otherwise be present.

In order to further reduce the number of electrical loads to one per byte lane, a component may be added to the motherboard which has a similar function to that of the memory buffer circuit present on the DIMM. This additional component, referred to herein as a 'byte lane switch', serves to extend the functionality of the memory buffer circuit by adding more byte lanes to accommodate the number of DIMM slots needed in the system, hence increasing the switching functionality to map the nine lanes from the controller to the n lanes needed to support the DIMMs.

In general, when the host controller has m byte lanes and the system is arranged such that the re-mapping scheme requires a total of n connections between the host controller's byte lanes and the DIMM slots, a byte lane switch may be interposed between the host and slots. The switch has at least m I/O ports connected to the host controller's m byte lanes, and n I/O ports connected to the DIMM slots. The switch is arranged to buffer data between the host controller's byte lanes and the DIMM slots such that the loading on each of the host controller's byte lanes is limited to no more than the one electrical load associated with the byte lane switch. For example, for a four DIMM system that does not need to support a population of just one DIMM as shown in FIGS. 7d-7g:

1. 9 byte lanes are needed to connect to the host controller (m=9), and
2. 18 byte lanes are needed to connect to the DIMM slots (n=18).

Alternatively, if a four DIMM system does need to support a population of just one 1 DIMM (contrary to the population rule discussed above), then:
1. 9 byte lanes are needed to connect to the host controller (m=9), and
2. 21 byte lanes are needed to connect to the DIMM slots (n=21).

As capacity is increased above four DIMM slots, more byte lanes are required. Typically, three byte lanes per DIMM slot will be added, though the design could map any combination of byte lanes for each rank available in the system, provided there are nine available from the population of available DIMMs.

As noted above, a fundamental grouping option of three bytes is preferred for mapping functions. This serves to minimize the number of CS pins needed to drive the sub-rank groupings on each DIMM. Each variation of DIMM population could vary the number of DRAMs selected from each DIMM for each rank; this could add significant complexity to the rank to CS decode for each DIMM, to the point where each byte may need its own CS. In the case of multiple ranks on a DIMM, this is a very high burden in terms of pin count, signal routing and complexity.

By accepting that the minimum number of byte lanes routed from the controller to the "first" striped DIMM slot will be at least six, then the number of CS pins required for nine bytes on any DIMM will be limited to three. If there are n addressable ranks on the DIMM, then (n×3) CS signals are required from the memory buffer circuit.

A conventional memory channel with a known number of DIMM slots will have a fixed number of CS signals. Each CS signal will allow one rank to be accessed, so that the number of ranks in a particular channel is limited to the number of CS signals available.

When the ranks are striped across multiple DIMMs as described herein, then the rank decoding function is performed by the iMB on each DIMM, with the iMB performing the same function in parallel but selecting different DRAMs according to its DIMM position and configuration. In order for the iMB to perform this function, it is preferably arranged to receive address signals from the host controller instead of decoded CS signals. In addition, a single "channel select" signal is preferably employed to initiate the rank decode function in each iMB on each of the DIMMs. This will reduce the number of pins needed on the host controller on the channel, as eight CS signals can be replaced with three address lines and a single channel select signal, for a savings of four pins per channel. As more ranks are required, more address pins are needed, but more pins are saved on the host controller and channel. In general, when a memory system has x ranks which are enabled with respective CS signals which are nominally provided by the host controller, the system and memory buffer circuits are preferably arranged such that the memory buffer circuits 1) receive y address signals from the host controller in lieu of said CS signals, with $2y \geq x$, 2) decode the address signals, and 3) provide the CS signals as needed to implement the re-mapping.

The new channel select signals will be common to all DIMMs and will provide consistent loading to the CA bus. Traditional channels with multiple DIMMs have 1 load for each DIMM on all the address and control signals, but the CS signals are most often connected in a point-to-point configuration. Hence, the traditional channel will have timing skews which are different for the CS signals compared to the address and control signals. By using all address lines and a single channel select signal, this problem no longer exists.

This arrangement also makes it possible for the number of ranks that can be addressed in a channel to be no longer limited by the number of CS signals. More address lines allow for more efficient rank expansion in a channel, which is now only limited by the addressing capability of the host controller and system design.

It should be noted that, even in cases where more than 1 DIMM will be needed to connect to all the byte lanes, there is always the option to run the system without all the lanes in use. This will reduce the available bandwidth of data to the controller, but provided the controller can accept the data on a subset of the byte lanes, the system will operate correctly. For example, assume a 2 DIMM configuration with half the data in each of the 2 slots (i.e., 1 load for every connection); when only 1 DIMM is fitted, there is half the bandwidth available.

Specifically, the Memory Buffer has the capability to perform data scrambling using any available state information such as addresses/bank addresses etc., together with optionally a programmable polynomial with programmable seed data. Data in DRAM is normally scrambled by the CPU. This is done to "spread out" the power peaks which can occur due to repetitive patterns on the data bus. Scrambling is a pseudo-random process. In order for the memory buffer to use any data that is in the DRAM (as opposed to passing it straight through), it has to de-scramble it. An example of this is DMA pointers. On writes from either a host controller or from the memory buffer the data is scrambled using this information, and in the reverse direction for reads the data is de-scrambled back to the original unscrambled format.

Error Correction Code, herein termed "ECC," protection is usually added to DRAM data by the CPU, which results in a 72 bit format for a 64 bit data word. It is usually single error correction, dual error detection (SECDEC). If the memory buffer wants to use the data (as opposed to passing it straight through), it is logical that its correctness would be verified, and if not correct to log the error and fix it if possible. An example of this is DMA pointers. It is possible that the ECC can be ignored and extra ECC be added to the normal 64 bit words. ECC is normally calculated over multiple 64 bit words and is also used in a technique called "chipkill" where the ECC is strong enough to continue in the presence of a single DRAM total failure (provided it is only a 4 bit DRAM). Scrambling and ECC are different, but are frequently used together.

Specifically with respect to ECC, the data to and from DRAM is ECC protected using a programmable ECC polynomial across the width of the whole bus or one or more partial sections of the bus as needed. On writes from the host or the memory buffer to the DRAM, the ECC is calculated for the given data word(s) and is written to the DRAM with the original data. On writes the ECC is checked for validity and used to indicate errors so that bad data is not used. If the data can be recovered by using the ECC information, then the recalculated data is used and the error is logged but processing can continue.

Due to the possible the presence of errors in the system, a parity protection scheme is usually provided. In DDR3, parity protection was on the address/command bus and is considered "fatal"; since the command that would otherwise have been sent to the DRAM may have put it into an illegal state, the CPU reaction to a parity error is to normally "crash" the system. In DDR3, it is possible to store the sequence of commands leading up to the error condition for failure analysis. In DDR4, there is additionally the concept of a data error by adding CRC protection to the data payload. As used herein, the term "CRC" A cyclic redundancy check (CRC) is a single-burst-error-detecting cyclic code and non-secure hash function designed to detect accidental changes to digital data in computer networks. It is not suitable for detecting maliciously introduced errors. It is characterized by specification of a so-called generator polynomial, which is used as the divisor in a polynomial long division over a finite field, taking the input data as the dividend, and where the remainder becomes the result. Cyclic codes have favorable properties in that they are well suited for detecting burst errors. CRCs are particularly easy to implement in hardware, and are therefore commonly used in digital networks and storage devices such as hard disk drives. Even parity is a special case of a cyclic redundancy check, where the single-bit CRC is generated by the divisor x+1. See, for example, Wikipedia.com. A CRC error is not necessarily fatal and can be potentially re-tried. If, on a write cycle, a CRC error is indicated by a DRAM device but the data was received at the data buffers CRC errorfree, the correct data can be saved in the buffer. If the host had the ability to retry the write cycle that was in error, it can do so without having to save the data. In addition the memory buffer could also have saved the address where the write error occurred at the DRAM, and if given access to the DRAM the memory buffer could retry the cycle autonomously without host control—provided that the host was not executing a concurrent cycle to the same memory. Of course as only the host has information as to what cycles it is generating to the DRAM, the host would have to direct the memory buffer to execute the "replay" so that the memory buffer knows it can access the DRAMs. However with a controller that supports a re-try signaling mechanism, a re-try can be invoked to enable the memory buffer to access DRAMs without interacting with the host controller if there is a conflicting cycle. It simply stores the address and data of the host cycle that could not be completed and if the host is trying to access to DRAM at the same time, it forces the host to retry that cycle.

As the memory buffer has access to DRAM data it can perform different functions on that data before passing on the data to an auxiliary port or ports, for example, or returning the processed data back to DRAM. Local processing of data for transmission to auxiliary ports will normally consist of some level of framing and/or encapsulation. For example, if the port is a SATA port then the processing will encompass packaging DRAM data into the correct format and with the correct command streams to pass the data to and from a downstream SATA device. If the auxiliary port were a network port then the processing involved would be packet processing involving adding address information and CRC generation and checking according to the protocol being implemented.

Of course, the above processing of data for auxiliary ports or the returning of processed data back to DRAM is not necessarily a fixed hardware function in the memory buffer chipset. It is usual for most type of data processing to be programmable either as a software or a firmware device or engine. This intelligent processing is useful, as there is the capability to change the software or firmware in response to various conditions which may necessitate an upgrade or increased functionality. Hence the processing internal to the memory buffer can be changed as desired, and return of the module for these changes is no longer required.

Various DRAM commands require that the host controller support some mechanisms for changing the timing based on operation speed and DRAM characteristics. In this case an opportunity exists to perform some "cycle stealing" by the memory buffer to access the DRAM while the controller has been deliberately over-provisioned on a particular timing parameter. An example of this is refresh, where the length or repeat time between subsequent refresh cycles can be adjusted. A disadvantage of extending these parameters is a small reduction in performance as seen on the host memory bus. However, for every memory buffer or DIMM behind the memory buffer, this "stolen" bandwidth is multiplied by the number of available buses. Therefore the performance lost can be mitigated based on the applications that are running on the system or there may even be a performance gain. The memory buffer can also be programmed to recognize this occurrence and perform DRAM cycles in the "stolen" cycles. Other examples include calibration parameters and using a broadcast capability for multiple ranks so that the subsequent rank action is no longer needed, and this time can then be used by the memory buffer if it is programmed to do so.

Receiving and returning CRC correct data to the CPU or DRAM is difficult to perform when the CRC algorithm is not available. When reading data from DRAM or receiving it from a CPU write, extra CRC protection needs to be provided as the host generated CRC will have to be removed as it cannot be checked. This extra CRC data will be contained in the existing data words which are 64 bits with a burst of 4 or 8 and will be generated by software. The memory buffer will know the algorithm and check that the data is correct before using it.

When data has to be returned to the CPU with correct CRC, it is necessary to use a table of data that is initialized by the CPU. The memory buffer is given the start address of this table and is also configured such that it can direct reads into this table based on certain configured internal status bits. For example, a 2 entry table can be used to indicate a busy or not busy status if the memory buffer diverts the read to entry 1 for busy or entry 2 for not busy. In a similar way, an 8 bit internal field would require a table of 256 entries. Note that the entries would be sized according to the minimum transfer size of the host CPU or system, so this mechanism is a little wasteful of memory. A simplifying technique is to use the burst ordering feature available in DRAM using A[2:0]. This allows the host to specify which word of an 8 word long burst is returned to the CPU first. If the host initializes the table so that each of the 8 words is different or numbered (e.g. 0 through 7) then the memory buffer can control the A[2:0] bits from internal status or register bits, and for each read (consisting of a burst of 8 transfers, each transfer consisting of 64 bits or 8 bytes of data together with another 8 bits of ECC), the host will be able to decode the state of the 3 bits as it will be given, for example, the data 0-7 based on the 3 bits of the internal status. This can be combined with the previous technique for multiple sets of 8 word entries.

Normally in a DRAM A[2:0] control, the order in which a DRAM sends back a burst of 8 transfers is as follows:

| A[2:0] coding | Burst order (example of sequential) |
| --- | --- |
| 0 0 0 | 0, 1, 2, 3, 4, 5, 6, 7 |
| 0 0 1 | 1, 2, 3, 0, 5, 6, 7, 4 |
| 0 1 0 | 2, 3, 0, 1, 6, 7, 4, 5 |
| 0 1 1 | 3, 0, 1, 2, 7, 4, 5, 6 |
| 1 0 0 | 4, 5, 6, 7, 0, 1, 2, 3 |

-continued

| A[2:0] coding | Burst order (example of sequential) |
| --- | --- |
| 1 0 1 | 5, 6, 7, 4, 1, 2, 3, 0 |
| 1 1 0 | 6, 7, 4, 5, 2, 3, 0, 1 |
| 1 1 1 | 7, 4, 5, 6, 3, 0, 1, 2 |

So, the CPU sets the A[2:0] according to which data is most critical for it to receive first.

Now in the memory buffer, some status bits are to be reported to the host. To accomplish this, we first of all choose an address that we want to use so that the memory buffer and the CPU use the same locations. The CPU initializes this table with a data pattern (say 0, 1, . . . to 7) in each location. When the CPU reads this table, the memory buffer ignores the A[2:0] presented and uses three internal bits for A[2:0] to the DRAM. When the data gets to the CPU, it can look at just the first word (or any word for that matter) and can determine the 3 bits reported by the memory buffer.

For example: host initializes 8 words of table so that word 0=0, word 1=1 etc. up to word 7=7. Host performs read of table, and memory buffer knows this table address is a status table. If, for example, memory buffer wishes to report 3 bit status of 101 (binary), sets A[2:0]=101 and host first word returned will be "5".

Now we can expand the table by using more locations to store these groups of 8. The table can be initialized so that, for example:
Word 0=0, word 1=1, up to word 7=7, then
Word 8=10, word 9=11, up to word 15=15
Word 16=20, word 17=21 up to word 23=27
Etc.

The memory buffer can now use higher address bits from A4 upwards to index the table and the host will be able to determine the address given to the DRAM and hence the status bits the memory buffer used to send to the address bits.

Finally, the host can program the memory buffer to tell it which group of bits to use as an index to the table (which can be of arbitrary size), and a method for the host to read any memory buffer status is achieved without the memory buffer having to generate ECC to the host. Obviously, the host only has 64 bits to use as a pattern for the initialization, but this should be sufficient.

The present memory system includes one or more memory buffers, each of which is arranged to buffer data and/or command instructions (e.g. bytes) being written to or read from random access memory (RAM chips) residing on a Dual In-line Memory Module (DIMM) by a host controller of a host computer system. In various embodiments, the RAM chips are referred to hereinafter as DRAM, though the invention is not limited to any specific memory chip type or technology.

In various embodiments, the memory buffer includes one or more additional hardware interfaces which are arranged to provide access to data stored in the DRAM chips, bypassing the host controller. In one example, the memory buffer might include a serial ATA (SATA) interface, or the like such that in addition to serving as a buffer between a host controller and the DRAM, the memory buffer also serves as a buffer between the host controller and/or DRAM and external devices capable of interfacing with a SATA interface.

The present system provides a means of storing diagnostic information about a failed DIMM module within a memory system, using the DIMM module itself. The system assumes that the DIMM module is used in a computer system capable of isolating a memory system failure to a specific component—in this case, a particular DIMM module. The system is arranged such that diagnostic information about the DIMM failure is stored on the DIMM module itself, so that the reason for failure can be determined at a later stage or at the manufacturer as part of an RMA process, for example. The stored data could be any diagnostic data that the memory system's host controller is capable of determining.

In an example, the present invention provides a technique including a method and system for logging DIMM errors. In an example, the technique may increase an available space of the "serial presence detect (SPD) circuit on the DIMM. In an example, the DIMM module has a 'serial presence detect' (SPD) circuit—an EPROM on the DIMM that identifies the DIMM and its characteristics. The SPD can be sized such that it can be used to store the extra diagnostic information discussed above. Upon the occurrence of an error or other event, the host memory controller can read out the command history log which provides a list of commands issued by the host before the host detected a failure and any other desirable system configuration information from the Registering Controlling Driver (PLL/Register) ("RCD") (a JEDEC-specified DDR register in the center of an RDIMM that repeats the address/control signals) via the existing bus interface (typically an SMBus interface), and then write that information into the larger SPD. Of course, there can be variations.

In an alternative example, the technique can also include a private non-volatile (NV) memory device port to the RCD. Upon the detection of a DIMM failure, error, or event, logic in the DDR register can autonomously dump the command history log and other important system configuration information into a non-volatile (NV) memory device such as an EPROM or EEPROM coupled to a private port on the RCD and residing on the DIMM.

By storing diagnostic information about a DIMM failure on the DIMM module itself, the relevant diagnos The embodiments of the invention described herein are exemplary and numerous modifications, variations and rearrangements can be readily envisioned to achieve substantially equivalent results, all of which are intended to be embraced within the spirit and scope of the invention as defined in the appended claims.

The invention claimed is:

1. A memory buffer circuit comprising:
   a memory interface to receive at least a portion of a data word from a first plurality of memory devices in a first Dual Inline Memory Module (DIMM);
   a processing engine to format the portion of the data word into a scrambled data word in response to a pseudo-random process; and
   a host interface to transfer the scrambled data word to a host controller in response to a data access request received from the host controller.

2. The memory buffer circuit of claim 1, wherein the memory buffer circuit is disposed in the first DIMM.

3. The memory buffer circuit of claim 1, wherein the memory buffer circuit is disposed in a second DIMM comprising a second plurality of memory devices.

4. The memory buffer circuit of claim 1, wherein the processing engine is to format the portion of the data word into the scrambled data word using state information comprising at least one of an address or a bank address.

5. The memory buffer circuit of claim 4, wherein the processing engine is further to format the portion of the data word into the scrambled data word using a programmable polynomial with programmable seed data.

6. The memory buffer circuit of claim 1, wherein the processing engine is further to de-scramble the scrambled data word into an unscrambled format.

7. The memory buffer circuit of claim 1, wherein the processing engine is further to subject the portion of the data word to an error correction code (ECC) characterized by a programmable ECC polynomial across a width of a communications bus.

8. A method of operation of a memory buffer circuit comprising:
receiving, by a memory interface of the memory buffer circuit, at least a portion of a data word from a first plurality of memory devices in a first Dual Inline Memory Module (DIMM);
formatting, by a processing engine of the memory buffer circuit, the portion of the data word into a scrambled data word in response to a pseudo-random process; and
transferring, by a host interface of the memory buffer circuit, the scrambled data word to a host controller in response to a data access request received from the host controller.

9. The method of claim 8, wherein the memory buffer circuit is disposed in the first DIMM.

10. The method of claim 8, wherein the memory buffer circuit is disposed in a second DIMM comprising a second plurality of memory devices.

11. The method of claim 8, wherein formatting the portion of the data word into the scrambled data word comprises using state information comprising at least one of an address or a bank address.

12. The method of claim 11, wherein formatting the portion of the data word into the scrambled data word comprises using a programmable polynomial with programmable seed data.

13. The method of claim 8, further comprising:
de-scrambling, by the processing engine of the memory buffer circuit, the scrambled data word into an unscrambled format.

14. The method of claim 8, further comprising:
subjecting, by the processing engine of the memory buffer circuit, the portion of the data word to an error correction code (ECC) characterized by a programmable ECC polynomial across a width of a communications bus.

15. A memory module comprising:
a plurality of memory devices; and
a memory buffer circuit configured to:
receive at least a portion of a data word from the plurality of memory devices;
format the portion of the data word into a scrambled data word in response to a pseudo-random process; and
transfer the scrambled data word to a host controller in response to a data access request received from the host controller.

16. The memory module of claim 15, wherein to format the portion of the data word into the scrambled data word, the memory buffer circuit is configured to use state information comprising at least one of an address or a bank address.

17. The memory module circuit of claim 16, wherein to format the portion of the data word into the scrambled data word, the memory buffer circuit is further configured to use a programmable polynomial with programmable seed data.

18. The memory module of claim 15, wherein the memory buffer circuit is further configured to de-scramble the scrambled data word into an unscrambled format.

19. The memory module of claim 15, wherein the memory buffer circuit is further configured to subject the portion of the data word to an error correction code (ECC) characterized by a programmable ECC polynomial across a width of a communications bus.

20. The memory module of claim 15, wherein the plurality of memory devices comprises dynamic random access memory (DRAM) devices.

* * * * *